United States Patent [19]
Manabe et al.

[11] Patent Number: 5,278,433
[45] Date of Patent: Jan. 11, 1994

[54] LIGHT-EMITTING SEMICONDUCTOR DEVICE USING GALLIUM NITRIDE GROUP COMPOUND WITH DOUBLE LAYER STRUCTURES FOR THE N-LAYER AND/OR THE I-LAYER

[75] Inventors: Katsuhide Manabe, Ichinomiya; Akira Mabuchi, Nagoya; Hisaki Kato, Okazaki; Michinari Sassa, Nagoya; Norikatsu Koide, Nagoya; Shiro Yamazaki, Inazawa; Masafumi Hashimoto; Isamu Akasaki, both of Nagoya, all of Japan

[73] Assignees: Toyoda Gosei Co., Ltd., Nishikasugai; Kabushiki Kaisha Toyota Chuo Kenkyusho, Aichi; Nagoya University, Nagoya; Research Development Corporation of Japan, Tokyo, all of Japan

[21] Appl. No.: 926,022

[22] Filed: Aug. 7, 1992

Related U.S. Application Data

[63] Continuation of Ser. No. 661,304, Feb. 27, 1991, abandoned.

[30] Foreign Application Priority Data

Feb. 28, 1990 [JP] Japan .................... 2-50209
Feb. 28, 1990 [JP] Japan .................... 2-50210
Feb. 28, 1990 [JP] Japan .................... 2-50211
Feb. 28, 1990 [JP] Japan .................... 2-50212

[51] Int. Cl.$^5$ .......................................... H01L 33/00
[52] U.S. Cl. .................................. 257/103; 257/79; 257/102
[58] Field of Search .................. 357/4, 16, 17, 61; 257/103, 79, 101, 102

[56] References Cited

U.S. PATENT DOCUMENTS

| 4,153,905 | 5/1979 | Charmakadze et al. | 357/61 |
| 4,268,842 | 5/1981 | Jacob et al. | 357/17 |
| 4,396,929 | 8/1983 | Ohki et al. | 357/61 |
| 4,408,217 | 10/1983 | Kobayashi et al. | 357/61 |
| 4,608,581 | 8/1986 | Bagratishvili et al. | 357/17 |
| 4,614,961 | 9/1986 | Khan et al. | 357/61 |

(List continued on next page.)

FOREIGN PATENT DOCUMENTS 277597 8/1988 European Pat. Off. ........... 357/17

(List continued on next page.)

OTHER PUBLICATIONS

Boulou et al., "Light emitting diodes based on GaN", Philips Tech. Rev. 37, 237-240, No. 9/10, 1977.
English Abstract of Ooki Japanese Application Published Sep. 19, 1982 Under No. 57-153479, Ooki, "Nitride Gallium Light Emitting Element."

Primary Examiner—Rolf Hille
Assistant Examiner—Minhloan Tran

[57] ABSTRACT

Disclosed herein are (1) a light-emitting semiconductor device that uses a gallium nitride compound semiconductor ($Al_xGa_{1-x}N$) in which the n-layer of n-type gallium nitride compound semiconductor ($Al_xGa_{1-x}N$) is of double-layer structure including an n-layer of low carrier concentration and an n+-layer of high carrier concentration, the former being adjacent to the i-layer of insulating gallium nitride compound semiconductor ($Al_xGa_{1-x}N$); (2) a light-emitting semiconductor device of similar structure as above in which the i-layer is of double-layer structure including an $i_L$-layer of low impurity concentration containing p-type impurities in comparatively low concentration and an $i_H$-layer of high impurity concentration containing p-type impurities in comparatively high concentration, the former being adjacent to the n-layer; (3) a light-emitting semiconductor device having both of the above-mentioned features and (4) a method of producing a layer of an n-type gallium nitride compound semiconductor ($Al_xGa_{1-x}N$) having a controlled conductivity from an organometallic compound by vapor phase epitaxy, by feeding a silicon-containing gas and other raw material gases together at a controlled mixing ratio.

19 Claims, 11 Drawing Sheets

U.S. PATENT DOCUMENTS

| | | | |
|---|---|---|---|
| 4,855,249 | 8/1989 | Akasaki et al. | 437/81 |
| 4,911,102 | 3/1990 | Manabe et al. | 118/719 |
| 4,946,548 | 8/1990 | Kotaki et al. | 156/643 |
| 5,005,057 | 4/1991 | Izumiya et al. | 357/17 |
| 5,006,908 | 4/1991 | Matsuoka et al. | 357/17 |

FOREIGN PATENT DOCUMENTS

| | | | |
|---|---|---|---|
| 2-738329 | 3/1978 | Fed. Rep. of Germany | 357/17 |
| 3-046018 | 9/1981 | Fed. Rep. of Germany | 357/17 |
| 54-71590 | 8/1979 | Japan | 357/17 |
| 56-59699 | 5/1981 | Japan | 357/17 |
| 57-18377 | 1/1982 | Japan | 357/17 |
| 57-87184 | 5/1982 | Japan | 357/17 |
| 57-46669 | 10/1982 | Japan | 357/17 |
| 58-12381 | 1/1983 | Japan | 357/17 |
| 58-46686 | 3/1983 | Japan | 357/17 |
| 61-7671 | 1/1986 | Japan | 357/17 |
| 62-119196 | 4/1987 | Japan | 357/17 |
| 63-188977 | 8/1988 | Japan | 357/17 |
| 54-71589 | 8/1989 | Japan | 357/17 |
| 2-81482 | 3/1990 | Japan | 357/17 |
| 2-81483 | 3/1990 | Japan | 357/17 |
| 2-81484 | 3/1990 | Japan | 357/17 |
| 1-589351 | 5/1981 | United Kingdom | 357/17 |

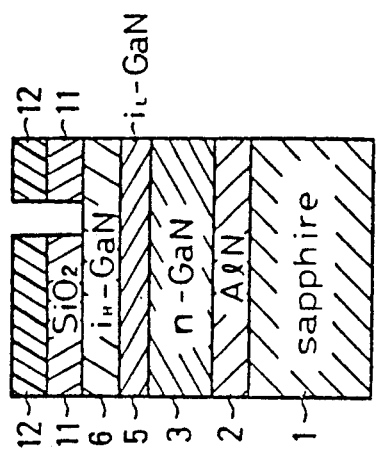
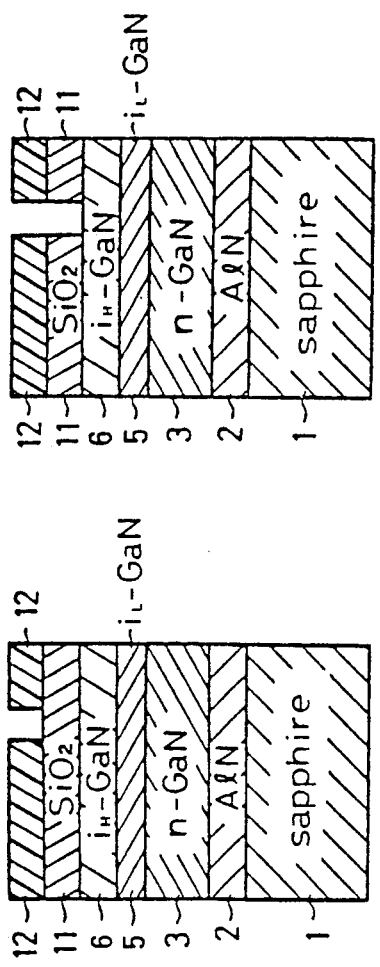
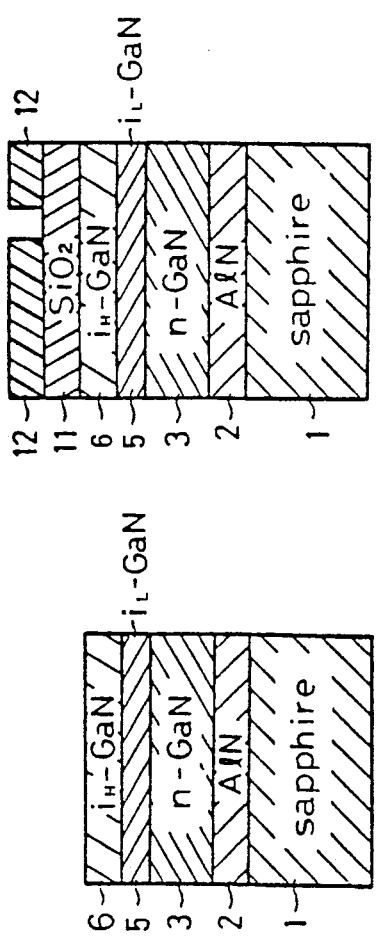
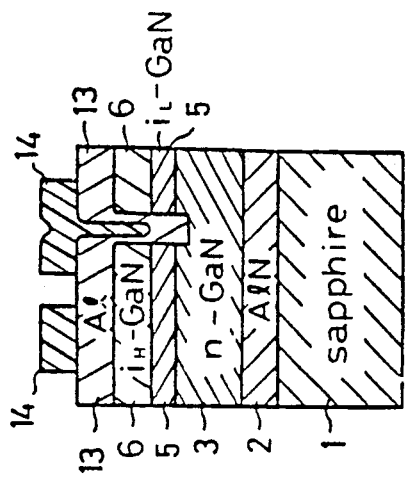
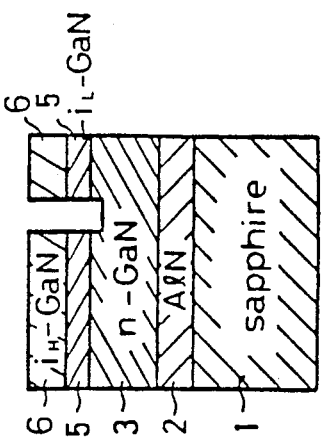
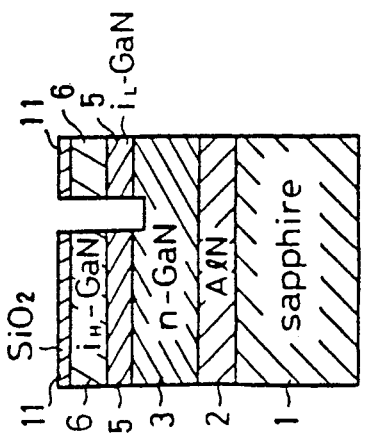

LIGHT-EMITTING SEMICONDUCTOR DEVICE USING GALLIUM NITRIDE GROUP COMPOUND WITH DOUBLE LAYER STRUCTURES FOR THE N-LAYER AND/OR THE I-LAYER

This is a continuation of application Ser. No. 07/661,304, filed on Feb. 27, 1991, which was abandoned upon the filing hereof.

BACKGROUND OF THE INVENTION

1. Field of the Invention

The present invention relates to a light-emitting semiconductor device using gallium nitride group compound which emits a blue light.

2. Description of the Prior Art

It is known that GaN compound semiconductor can be made into a light-emitting semiconductor device, such as a light-emitting diode (LED), which emits a blue light. The GaN compound semiconductor attracts attention because of its high light-emitting efficiency resulting from direct transition and of its ability to emit a blue light which is one of three primary colors.

The light-emitting diode manufactured from the GaN compound semiconductor is composed of an n-layer and an i-layer grown thereon. The n-layer of the GaN compound semiconductor with n-type conduction is directly grown on a surface of a sapphire substrate or grown on a buffer layer of aluminum nitride formed on the substrate. The i-layer of insulating (i-type) GaN compound semiconductor doped with p-type impurities is grown on the n-layer. (See Japanese Patent Laid-open Nos. 119196/1987 and 188977/1988.) The light-emitting diode of this structure has room for improvement in luminous intensity. In addition, it comprises no p-n junction but it is made by joining the i-layer and n-layer.

An electric property of the GaN compound semiconductor shows inherently n-type conduction even though it is not deliberately doped with n-type impurities, and unlike silicon and similar semiconductors, when it is doped with zinc of p-type impurities, the electric property shows not p-type conduction but insulation. Moreover, the production of n-type GaN involves many difficulties in controlling conductivity.

SUMMARY OF THE INVENTION

It is the first object of the present invention to improve a luminous efficiency of a GaN group light-emitting diode.

It is the second object of the present invention to provide a new layer structure which improves a luminous efficiency of a GaN group light-emitting diode.

It is the third object of the present invention to provide a technology for production of n-type GaN group compound semiconductor in which conductivity is easily controlled.

After experience in the manufacture of the above-mentioned GaN light-emitting diode, the present inventors established a technology for a vapor phase epitaxy of the GaN group semiconductor with organometal compound. This technology enables a production of a gas-phase grown GaN layer of high purity. In other words, this technology provides n-type GaN with high resistivity without doping with impurities, unlike the conventional technology which provides n-type GaN with low resistivity when no doping is performed. The first feature of the invention;

The first feature of the present invention resides in a light-emitting semiconductor device composed of an n-layer of n-type gallium nitride group compound semiconductor ($Al_xGa_{1-x}N$; inclusive of $x=0$) and an i-layer of insulating (i-type) gallium nitride compound semiconductor ($Al_xGa_{1-x}N$; inclusive of $x=0$) doped with p-type impurities, in which the n-layer is of double-layer structure including an n-layer of low carrier concentration and an n+-layer of high carrier concentration, the former being adjacent to the i-layer.

According to the present invention, the n-layer of low carrier concentration should preferably have a carrier concentration of $1 \times 10^{14}/cm^3$ to $1 \times 10^{17}/cm^3$ and have a thickness of 0.5 to 2 μm. In the case where the carrier concentration is higher than $1 \times 10^{17}/cm^3$, the luminous intensity of the light-emitting diode decreases. In the case where the carrier concentration is lower than $1 \times 10^{14}/cm^3$, since the series resistance of the light-emitting diode increases, an amount of heat generated in the n-layer increases when a constant current is supplied to it. In the case where the layer thickness is greater than 2 μm, since the series resistance of the light-emitting diode increases, the amount of heat generated in the n-layer increases when the constant current is supplied to it. In the case where the layer thickness is smaller than 0.5 μm, the luminous intensity of the light-emitting diode decreases.

In addition, the n+-layer of high carrier concentration should preferably contain a carrier concentration of $1 \times 10^{17}/cm^3$ to $1 \times 10^{19}/cm^3$ and have a thickness of 2-10 μm. In the case where the carrier concentration is higher than $1 \times 10^{19}/cm^3$, the n+-layer is poor in crystallinity. In case that the carrier concentration is lower than $1 \times 10^{17}/cm^3$, since the series resistance of the light-emitting diode increases, an amount of heat generated in the n+-layer increases when a constant current is supplied to it. In the case where the layer thickness is greater than 10 μm, the substrate of the light-emitting diode warps. In case that the layer thickness is smaller than 2 μm, since the series resistace of the light-emitting diode increases, the amount of heat generated in the n+-layer increases when the constant current is supplied to it.

In the first feature of the present invention, it is possible to increase an intensity of blue light emitted from the light-emitting diode by making the n-layer in double-layer structure including an n-layer of low carrier concentration and an n+-layer of high carrier concentration, the former being adjacent to the i-layer. In other words, the n-layer as a whole has a low electric resistance owing to the n+-layer of high carrier concentration, and hence the light-emitting diode has low series resistance and generates less heat when a constant current is supplied to it. The n-layer adjacent to the i-layer has a lower carrier concentration or higher purity so that it contains a smaller amount of impurity atoms which are deleterious to the emission of blue light from the light-emission region (i-layer and its vicinity). Due to the above-mentioned functions, the light-emitting diode of the present invention emits a blue light of higher intensity.

The second feature of the present invention resides in a light-emitting semiconductor device composed of an n-layer of n-type gallium nitride compound semiconductor ($Al_xGa_{1-x}N$; inclusive of $x=0$) and an i-layer of i-type gallium nitride compound semiconductor ($Al_xGa_{1-x}N$; inclusive of $x=0$) doped with p-type impurities, in which the i-layer is of double-layer structure including an $i_L$-layer containing p-type impurities in comparatively low concentration and an $i_H$-layer containing p-type impurities in comparatively high concentration, the former being adjacent to the n-layer.

According to the present invention, the $i_L$-layer of low impurity concentration should preferably contain the impurities in concentration of $1\times10^{16}/cm^3$ to $5\times10^{19}/cm^3$ and have a thickness of 0.01 to 1 μm. In the case where impurity concentration is higher than $5\times10^{19}/cm^3$, since the series resistance of the light-emitting diode increases, an initial voltage to start emitting light increases. In the case where the impurity concentration is lower than $1\times10^{16}/cm^3$, the semiconductor of the $i_L$-layer shows n-type conduction. In the case where the layer thickness is greater than 1 μm, since the series resistance of the light-emitting diode increases, the initial voltage to start emitting light at increases. In the case where the layer thickness is smaller than 0.01 μm, the light-emitting diode has the same structure as that of the conventional one.

In addition, the $i_H$-layer of high impurity concentration should preferably contain the impurities in concentration of $1\times10^{19}/cm^3$ to $5\times10^{20}/cm^3$ and have a thickness of 0.02 to 0.3 μm. In the case where the impurity concentration is higher than $5\times10^{20}/cm^3$, the semiconductor of the $i_H$-layer is poor in crystallinity. In the case where the impurity concentration is lower than $1\times10^{19}/cm^3$, the luminous intensity of the light-emitting diode decreases. In the case where the layer thickness is greater than 0.3 μm, since the series resistance of the light-emitting diode increases, an initial voltage to start emitting light at increases. In the case where the layer thickness is smaller than 0.02 μm, the i-layer is subject to breakage.

In the second feature of the present invention, it is possible to increase an intensity of blue light emitted from the light-emitting diode by making the i-layer in double-layer structure including an $i_L$-layer containing p-type impurities in comparatively low concentration and an $i_H$-layer containing p-type impurities in comparatively high concentration, the former being adjacent to the n-layer. In other words, this structure (in which the i-layer adjacent to the n-layer is the $i_L$-layer of low impurity concentration) enables electrons to be injected from the n-layer into the $i_H$-layer of high impurity concentration without being trapped in the $i_L$-layer and its vicinity. Therefore, this structure enables electrons to pass through the $i_L$-layer of low impurity concentration, which is poor in luminous efficacy, adjacent to the n-layer, and to reach the $i_H$-layer of high impurity concentration in which electrons emit light with a high efficiency.

The third feature of the invention

The third feature of the present invention resides in a light-emitting semiconductor device composed of an n-layer of n-type gallium nitride compound semiconductor ($Al_xGa_{1-x}N$; inclusive of x=0) and an i-layer of i-type gallium nitride compound semiconductor ($Al_xGa_{1-x}N$; inclusive of x=0) doped with p-type impurities, in which the n-layer is of double-layer structure including an n-layer of low carrier concentration and an $n^+$-layer of high carrier concentration, the former being adjacent to the i-layer, and the i-layer is of double-layer structure including an $i_L$-layer containing p-type impurities in comparatively low concentration and an $i_H$-layer containing p-type impurities in comparatively high concentration, the former being adjacent to the n-layer.

The third feature of the present invention is a combination of the first feature (the n-layer of double layer structure) and the second feature (the i-layer of double layer structure). Therefore, the n-layer of low carrier concentration, the $n^+$-layer of high carrier concentration, the $i_L$-layer of low impurity concentration, and the $i_H$-layer of high impurity concentration should correspond to the respective layers as the first and second features. The carrier concentration and layer thickness are defined in the same manner as in the first and second features.

In the third feature of the present invention, it is possible to increase an intensity of blue light from the light-emitting diode by making the n-layer in double-layer structure including an n-layer of low carrier concentration and an $n^+$-layer of high carrier concentration, the former being adjacent to the i-layer, and also by making the i-layer in double-layer structure including an $i_L$-layer containing p-type impurities in comparatively low concentration and an $i_H$-layer containing p-type impurities in comparatively high concentration, the former being adjacent to the n-layer.

In other words, the n-layer as a whole has a low electric resistance owing to the $n^+$-layer of high carrier concentration, which makes it possible to apply an effective voltage to the junction between the $i_L$-layer and n-layer of low carrier concentration. Having a low carrier concentration, the n-layer adjacent to the $i_L$-layer does not permit non-light-emitting impurity atoms to diffuse into the $i_L$-layer. In addition, this structure (in which the i-layer adjacent to the n-layer is the $i_L$-layer of low impurity concentration) permits electrons to be injected from the n-layer into the $i_H$-layer of high impurity concentration without being trapped in the $i_L$-layer. Therefore, this structure permits electrons to pass through the $i_L$-layer of low impurity concentration, which is poor in luminous efficacy, adjacent to the n-layer, and to reach the $i_H$-layer of high impurity concentration in which electrons emit light with a high efficiency.

For this reason, the light-emitting diode of the present invention has a much higher luminous efficacy than the one having the conventional simple i-n junction.

The fourth feature of the invention

The fourth feature of the present invention resides in a method of producing an n-type gallium nitride compound semiconductor ($Al_xGa_{1-x}N$; inclusive of x=0) from organometal compound by vapor phase epitaxy. This method comprises a step of feeding a silicon-containing gas and other raw material gases together at a proper mixing ratio so that the conductivity of the compound semiconductor is desirably controlled. The mixing ratio is adjusted such that silicon enters the layer of gallium nitride compound semiconductor grown by vapor phase epitaxy and functions as the donor therein. Thus it is possible to vary the conductivity of the n-type layer by adjusting the mixing ratio.

The fifth feature of the invention

The fifth feature of the present invention resides in a method for producing a light-emitting semiconductor device. The method comprises two steps. The first step involves growing an $n^+$-layer of high carrier concentration (which is an n-type gallium nitride compound semiconductor ($Al_xGa_{1-x}N$; inclusive of x=0) having a comparatively high conductivity) by vapor phase epitaxy from organometal compound. The vapor phase epitaxy is accomplished on a sapphire substrate having a buffer layer of aluminum nitride by feeding a silicon-containing gas and other raw material gases together at a proper mixing ratio. The second step involves growing an n-layer of low carrier concentration (which is an n-type gallium nitride compound semiconductor ($Al_x$-$Ga_{1-x}N$; inclusive of x=0) having a comparatively low conductivity) by vapor phase epitaxy from organometal compound. The vapor phase epitaxy is accomplished on the n+-layer formed by the first step by feeding raw material gases excluding the silicon-containing gas. The n-layer of double-layer structure can be produced by properly controlling the mixing ratio of a silicon-containing gas and other raw material gases.

BRIEF DESCRIPTION OF THE DRAWINGS

FIGS. 10 to 15 are sectional views illustrating processes for producing a light-emitting diode shown as Example 2 of the present invention.

DETAILED DESCRIPTION OF THE INVENTION

The invention will be described in more detail with reference to the following examples.

Example 1

Figure 1:
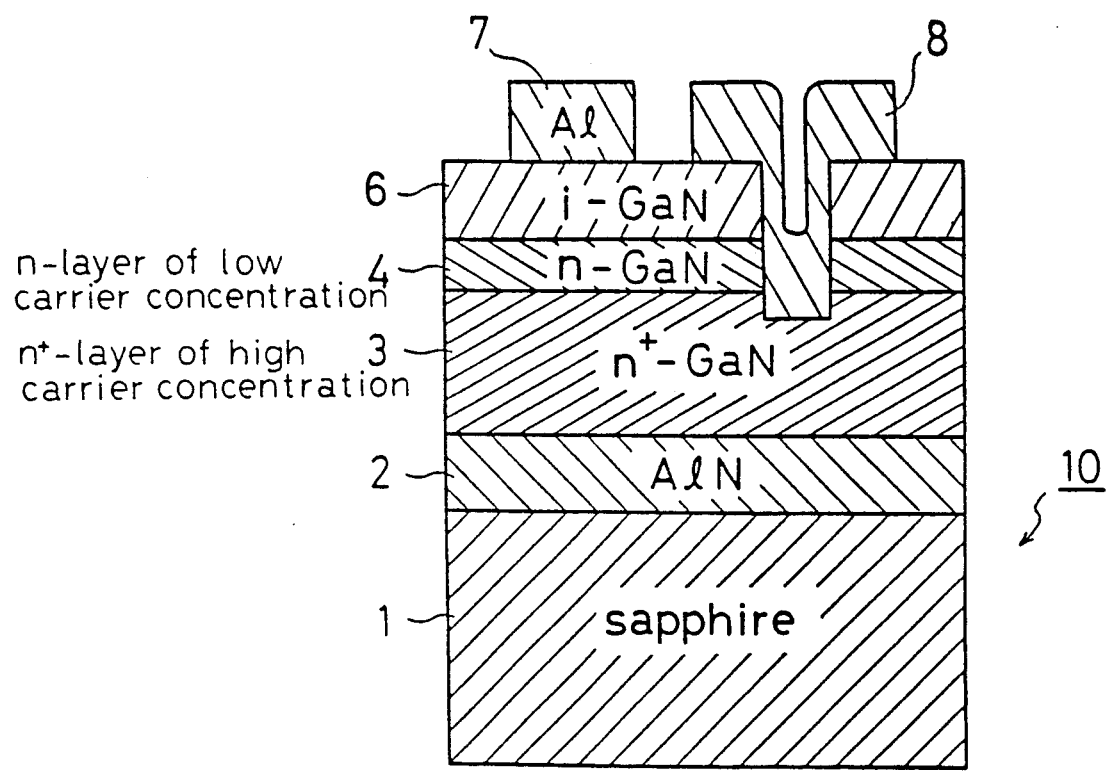
FIG. 1 is a diagram showing a structure of a light-emitting diode shown as Example 1 of the present invention.

In FIG. 1 there is shown a light-emitting diode 10 which has a sapphire substrate 1 on which is formed a buffer layer of 500 Å thick AlN. On the buffer layer 2 are consecutively formed an n+-layer 3 of high carrier concentration of 2.2 μm thick GaN and an n-layer 4 of low carrier concentration of 1.5 μm thick GaN. And an i-(insulating) layer 6 of 0.2 μm thick GaN is formed on the n-layer 4. Aluminum electrodes 7 and 8 are connected to the i-layer 6 and n+-layer 3, respectively.

This light-emitting diode 10 was produced by metal-organic vapor phase epitaxy in the following manner. (This process is referred to as MOVPE hereinafter.)

The gases employed in this process are $NH_3$, $H_2$ (as carrier gas), trimethyl gallium ($Ga(CH_3)_3$) (TMG hereinafter), trimethyl aluminum ($Al(CH_3)_3$) (TMA hereinafter), silane ($SiH_4$), and diethyl zinc (DEZ hereinafter).

The sapphire substrate 1 of single crystal, with its principal crystal plane (a-surface $\{11\bar{2}0\}$) cleaned by solvent washing and heat treatment, was set on the susceptor placed in a reaction chamber of an MOVPE apparatus.

The sapphire substrate 1 underwent vapor phase etching at 1100° C. with $H_2$ flowing through the reaction chamber at a flow rate of 2 l/min under normal pressure.

On the sapphire substrate 1 was formed the AlN buffer layer 2 (about 500 Å thick) at 400° C. by supplying $H_2$ at a flow rate of 20 l/min, $NH_3$ at a flow rate of 10 l/min, and TMA at a flow rate of $1.8 \times 10^{-5}$ mol/min.

On the buffer layer 2 was formed the n+-layer 3 of high carrier concentration ($1.5 \times 10^{18}/cm^3$) of 2.2 μm thick GaN by supplying $H_2$ at a flow rate of 20 l/min, $NH_3$ at a flow rate of 10 l/min, TMG at a flow rate of $1.7 \times 10^{-4}$ mol/min, and silane (diluted to 0.86 ppm with $H_2$) at a flow rate of 200 ml/min, with the sapphire substrate 1 kept at 1150° C.

On the n+-layer 3 was formed the n-layer 4 of low carrier concentration ($1 \times 10^{15}/cm^3$) of 1.5 μm thick GaN by supplying $H_2$ at a flow rate of 20 l/min, $NH_3$ at a flow rate of 10 l/min, and TMG at a flow rate of $1.7 \times 10^{-4}$ mol/min, with the sapphire substrate 1 kept at 1150° C.

On the n-layer 4 was formed the i-layer 6 of 0.2 μm thick GaN by supplying $H_2$ at a flow rate of 20 l/min, $NH_3$ at a flow rate of 10 l/min, TMG at a flow rate of $1.7 \times 10^{-4}$ mol/min, and DEZ at a flow rate of $1.5 \times 10^{-4}$ mol/min, with the sapphire substrate 1 kept at 900° C.

Figure 2:
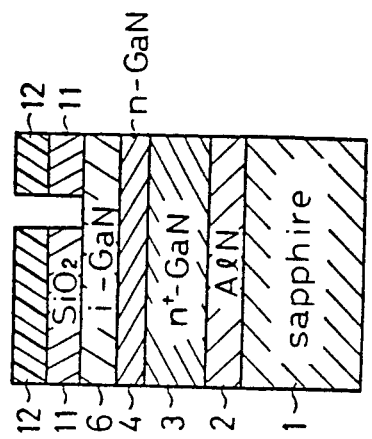
FIGS. 2 to 7 are sectional views illustrating processes for producing a light-emitting diode shown as to Example 1 of the present invention.

Thus there was obtained the multi-layer structure as shown in FIG. 2.

Figure 3:
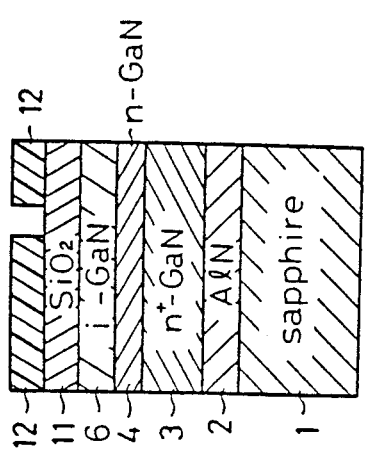

On the i-layer 6 was formed a 2000 Å thick $SiO_2$ layer 11 by sputtering as shown in FIG. 3. On the $SiO_2$ layer 11 was formed a photoresist layer 12 which subsequently underwent a photolithographic processing to make a pattern corresponding to a figure of the electrode connected to the $n^3$-layer 3.

Figure 4:
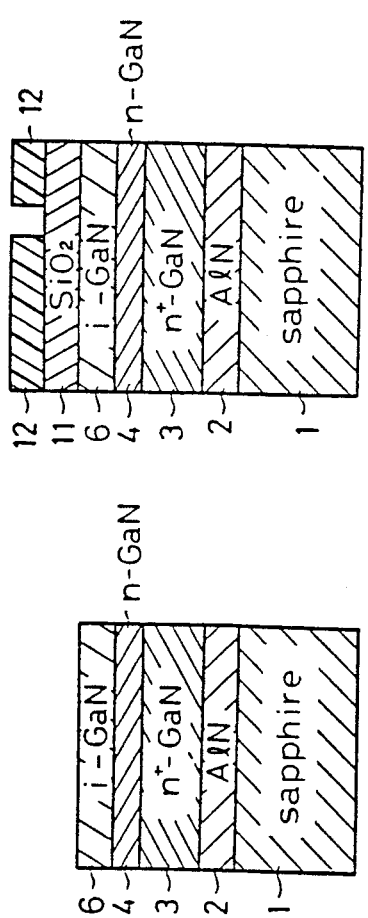

The exposed part (not covered by the photoresist layer 12) of the $SiO_2$ layer 11 underwent etching with hydrofluoric acid for its removal, as shown in FIG. 4.

Figure 5:
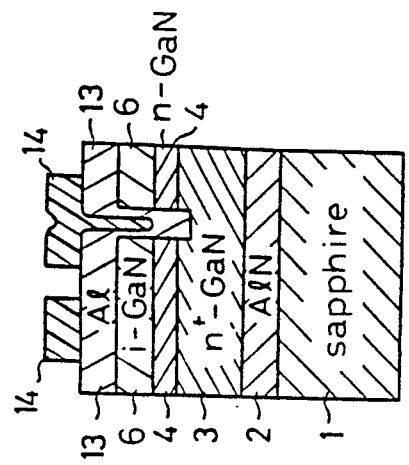

The exposed part (not covered by the photoresist layer 12 and the $SiO_2$ layer 11) of the i-layer 6 underwent dry etching with $CCl_2F_2$ gas at a flow rate of 10 cc/min and a high-frequency electric power of 0.44 W/cm² in a vacuum of 0.04 Torr and subsequently underwent dry etching with argon. The dry etching removed not only the exposed part of the i-layer 6 but also the n-layer 4 and the upper part of the n+-layer 3 which are underneath the exposed part of the i-layer 6, as shown in FIG. 5.

Figure 6:
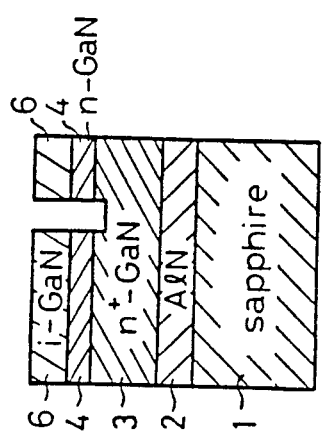

The $SiO_2$ layer 11 remaining on the i-layer 6 was removed with hydrofluoric acid as shown in FIG. 6.

Figure 7:
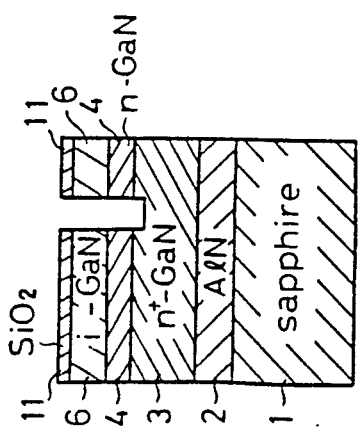

On the entire surface of the sample was formed an Al layer 13 by vapor deposition as shown in FIG. 7. On the Al layer 13 was formed a photoresist layer 14 which subsequently underwent the photolithographic processing to make a pattern corresponding to a figure of the electrodes connected to the n+-layer 3 and the i-layer 6, respectively.

The exposed part (not covered by the photoresist layer 14) of the Al layer 13 underwent etching with nitric acid as shown in FIG. 7. The photoresist 14 was removed with acetone. Thus there were formed the electrode 8 for the n+-layer 3 and the electrode 7 for the i-layer 6.

Such an above-mentioned process could make a gallium nitride light-emitting element of MIS (metal-insulator-semiconductor) structure as shown in FIG. 1.

The thus obtained light-emitting diode 10 was found to have a luminous intensity of 0.2 mcd. This value is 4 times higher than that of the conventional light-emitting diode which is composed simply of an i-layer with impurity concentration of $2 \times 10^{20}/cm^3$ and a 4 μm thick n-layer with carrier concentration of $5 \times 10^{17}/cm^3$.

In addition, the inspection of the luminescent surface revealed that the number of luminescent points is much greater than that of the conventional light-emitting diode.

Figure 8:
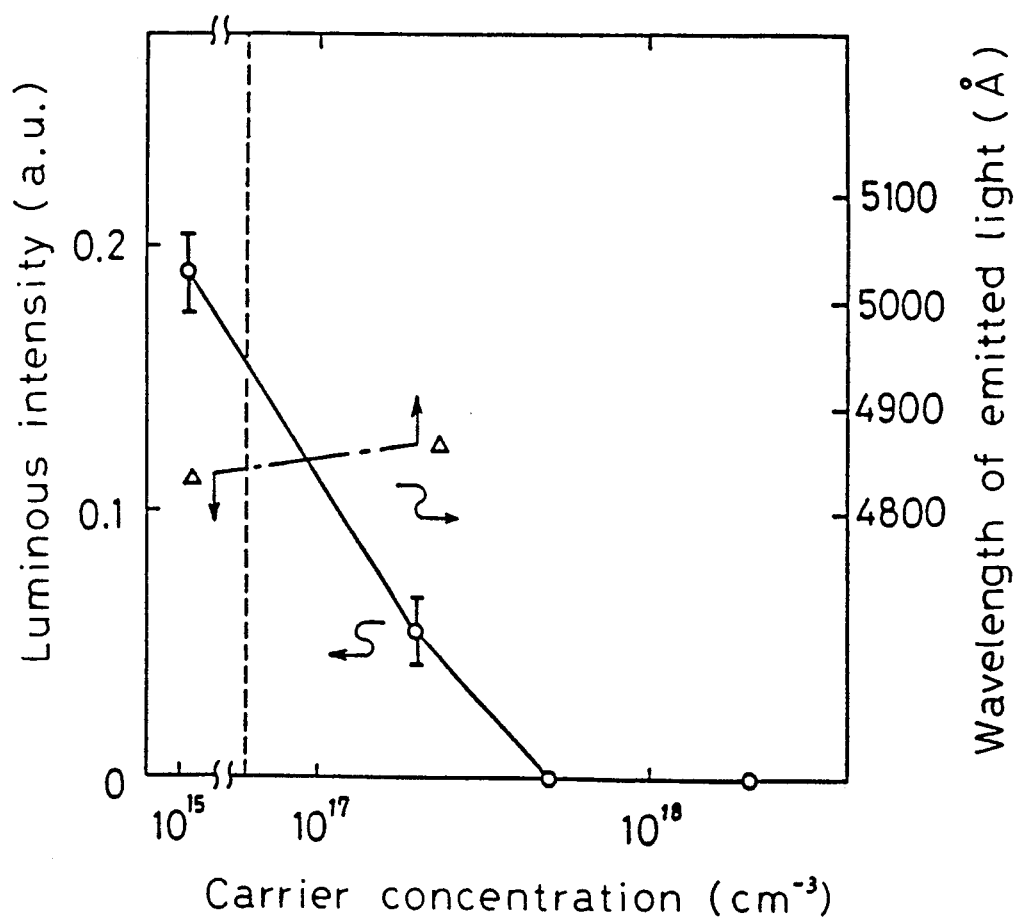
FIG. 8 is a diagram showing relationship between a carrier concentration of an n-layer of low carrier concentration and intensity or wavelength of emitted light with respect to a light-emitting diode shown as Example 1 of the present invention.

Several samples were prepared in the same manner as mentioned above except that the carrier concentration in the n-layer of low carrier concentration was varied, and they were tested for luminous intensity and emission spectrum. The results are shown in FIG. 8. It is noted that the luminous intensity decreases and the emission spectrum shifts to the red side according as the carrier concentration increases. This effect is estimated to be caused by that atoms of silicon as doping atoms diffuse or mix into the i-layer 6 as impurity atoms.

Example 2

Figure 9:
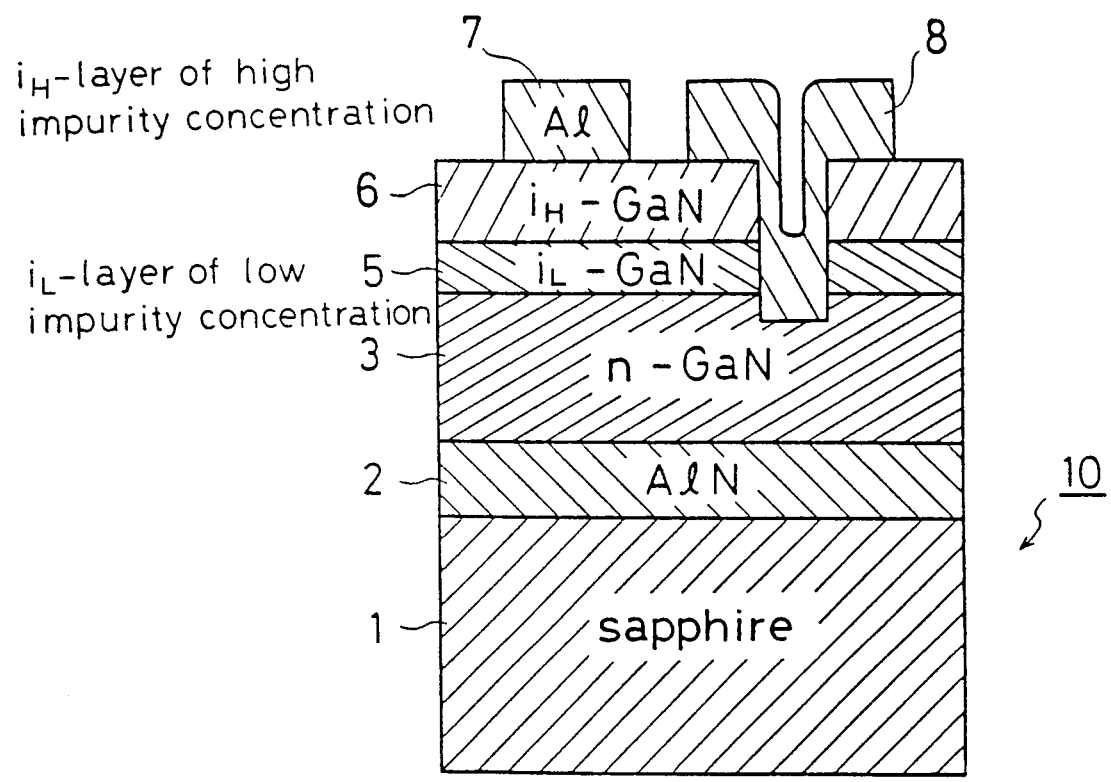
FIG. 9 is a diagram showing a structure of a light-emitting diode shown as Example 2 of the present invention.

In FIG. 9 there is shown a light-emitting diode 10 which has a sapphire substrate 1 on which is formed a 500 Å thick AlN buffer layer 2. On the buffer layer 2 are consecutively formed a 4 μm thick GaN n-layer 3 with carrier concentration of $5 \times 10^{17}/cm^3$, an $i_L$-layer 5 of low impurity concentration of $5 \times 10^{19}/cm^3$ of Zn, and an $i_H$-layer 6 of high impurity concentration ($2 \times 10^{20}/cm^3$ of Zn). To the $i_H$-layer 6 and n-layer 3 are connected aluminum electrodes 7 and 8, respectively.

This light-emitting diode 10 was produced by the MOVPE.

The gases employed in this process are NH3, H2 (as carrier gas), trimethyl gallium TMG, trimethyl aluminum TMA, and diethyl zinc DEZ.

The sapphire substrate 1 of single crystal, with its principal crystal plane (c-surface {0001}) cleaned by solvent washing and heat treatment, was set on the susceptor placed in the reaction chamber of the MOVPE apparatus.

The sapphire substrate 1 underwent vapor phase etching at 1100° C. with H2 flowing through the reaction chamber at a flow rate of 2 l/min under normal pressure.

On the sapphire substrate 1 was formed the AlN buffer layer 2 (about 500 Å thick) at 400° C. by supplying H2 at a flow rate of 20 l/min, NH3 at a flow rate of 10 l/min, and TMA at a flow rate of $1.8 \times 10^{-5}$ mol/min.

On the buffer layer 2 was formed the 4 μm thick GaN n-layer 3 with carrier concentration of $1.5 \times 10^{17}/cm^3$ by supplying H2 at a flow rate of 20 l/min, NH3 at a flow rate of 10 l/min, and TMG at a flow rate of $1.7 \times 10^{-4}$ mol/min with stopping the feeding of TMA, with the sapphire substrate 1 kept at 1150° C.

On the n-layer 3 was formed the 0.2 μm thick GaN $i_L$-layer 5 of low impurity concentration ($5 \times 10^{19}/cm^3$ of Zn) by supplying H2 at a flow rate of 20 l/min, NH3 at a flow rate of 10 l/min, TMG at a flow rate of $1.7 \times 10^{-4}$ mol/min, and DEZ at a flow rate of $1.5 \times 10^{-4}$ mol/min, with the sapphire substrate 1 kept at 1000° C.

On the $i_L$-layer 5 was formed the 0.2 μm thick GaN $i_H$-layer 6 of high impurity concentration ($2 \times 10^{20}/cm^3$ of Zn) by supplying H2 at a flow rate of 20 l/min, NH3 at a flow rate of 10 l/min, TMG at a flow rate of $1.7 \times 10^{-4}$ mol/min, and DEZ at a flow rate of $1.5 \times 10^{-4}$ mol/min, with the sapphire substrate 1 kept at 900° C.

Thus there was obtained the multi-layer structure as shown in FIG. 10.

On the $i_H$-layer 6 was formed the 2000 Å thick SiO2 layer 11 by sputtering as shown in FIG. 11. On the SiO2 layer 11 was formed a photoresist layer 12 which subsequently underwent the photolithographic processing to make a pattern corresponding to the figure of the electrode connected to the n-layer 3.

The exposed part (not covered by the photoresist layer 12) of the SiO2 layer 11 underwent etching with hydrofluoric acid for its removal, as shown in FIG. 12.

The exposed part (not covered by the photoresist layer 12 and the SiO2 layer 11) of the $i_H$-layer 6 underwent dry etching with CCl2F2 gas at a flow rate of 10 cc/min and a high-frequency electric power of 0.44 W/cm2 in a vacuum of 0.04 Torr and subsequently underwent dry etching with argon. The dry etching removed not only the exposed part of the $i_H$-layer 6 but also the $i_L$-layer 5 and the upper part of the n-layer 3 which are underneath the exposed part of the $i_H$-layer 6, as shown in FIG. 13.

The SiO2 layer 11 remaining on the $i_H$-layer 6 was removed with hydrofluoric arid as shown in FIG. 14.

On the entire surface of the sample was formed an Al layer 13 by vapor deposition as shown in FIG. 15. On the Al layer 13 was formed the photoresist layer 14 which subsequently underwent the photolithographic processing to make a pattern corresponding to the figure of the electrodes connected to the n-layer 3 and the $i_H$-layer 6, respectively.

The exposed part (not covered by the photoresist layer 14) of the Al layer 13 underwent etching with nitric acid as shown in FIG. 15. The photoresist 14 was removed with acetone. Thus there were formed the electrode 8 for the n-layer 3 and the electrode 7 for the $i_H$-layer 6.

Such an above-mentioned process could make a gallium nitride light-emitting element of MIS structure as shown in FIG. 9.

The thus obtained light-emitting diode 10 was found to have a luminous intensity of 0.2 mcd. This value is 4 times higher than that of the conventional light-emitting diode which is composed simply of a 0.2 μm thick i-layer with impurity concentration of $2 \times 10^{20}/cm^3$ and a 4 μm thick n-layer with carrier concentration of $5 \times 10^{17}/cm^3$.

In addition, the inspection of the luminescent surface revealed that the number of luminescent points is much greater than that of the conventional light-emitting diode.

Figure 16:
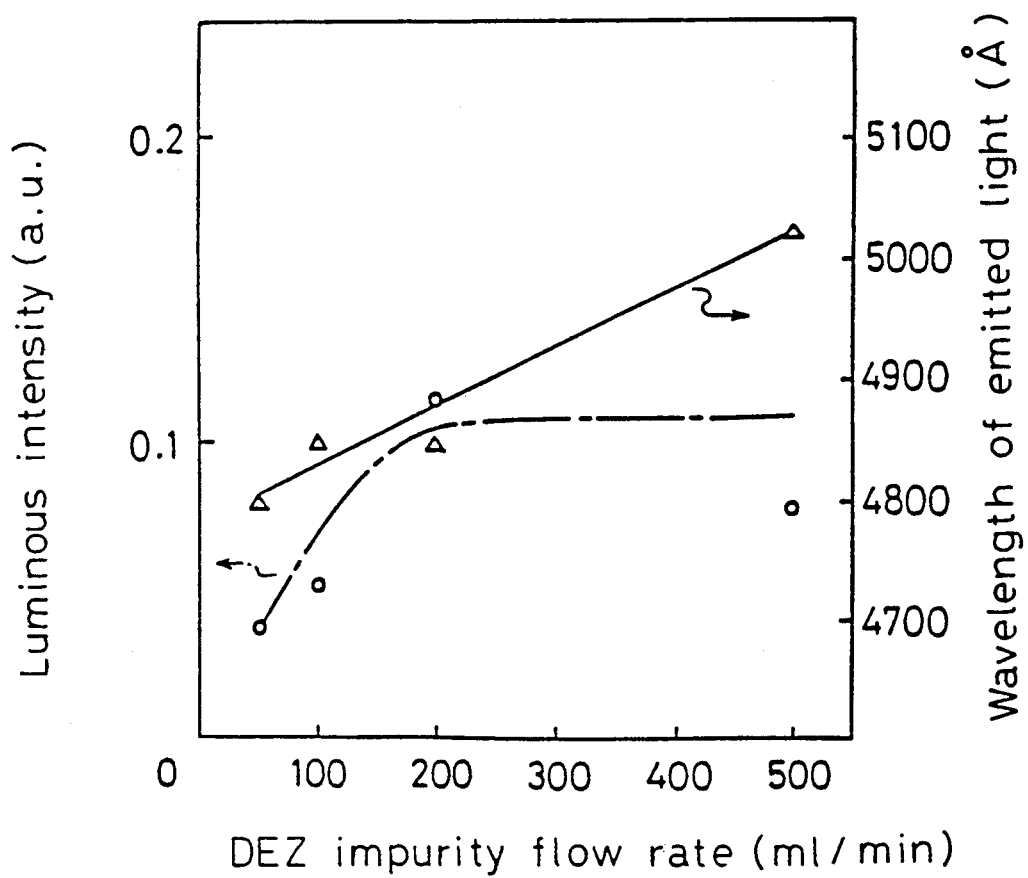
FIG. 16 is a diagram showing relationship between an impurity concentration of an $i_H$-layer of high impurity concentration and intensity or wavelength of emitted light with respect to a light-emitting diode shown as Example 2 of the present invention.

Several samples were prepared in the same manner as mentioned above except that the impurity concentration in the $i_H$-layer 6 of high impurity concentration was varied, and they were tested for luminous intensity and emission spectrum. The results are shown in FIG. 16. It is noted that the luminous intensity has a peak value and the emission spectrum shifts to a longer wavelength side when the impurity concentration increases.

Example 3

Figure 17:
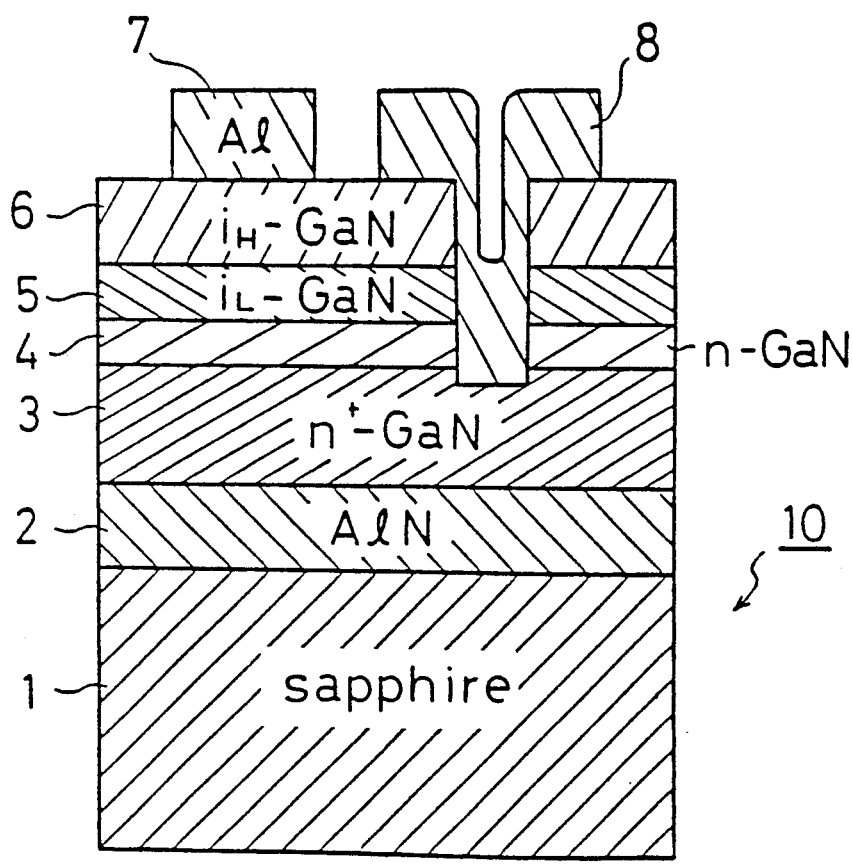
FIG. 17 is a diagram showing a structure of a light emitting diode shown as Example 3 of the present invention.

In FIG. 17 there is shown a light-emitting diode 10 which has a sapphire substrate 1 on which is formed a 500 Å thick AlN buffer layer 2. On the buffer layer 2 are consecutively formed a 2.2 μm thick GaN n+-layer 3 of high carrier concentration ($1.5 \times 10^{18}$/cm$^3$), a 1.5 μm thick GaN n-layer 4 of low carrier concentration ($1 \times 10^{15}$/cm$^3$), an $i_L$-layer 5 of low impurity concentration ($5 \times 10^{19}$/cm$^3$ of Zn), and an $i_H$-layer 6 of high impurity concentration ($2 \times 10^{20}$/cm$^3$ of Zn). To the $i_H$ layer 6 and n+-layer 3 are connected aluminum electrodes 7 and 8, respectively. This light-emitting diode 10 was produced by the MOVPE with organometal compound in the following manner.

The gases employed in this process are NH$_3$, H$_2$ (as carrier gas), trimethyl gallium (Ga(CH$_3$)$_3$) (TMG), trimethyl aluminum (Al(CH$_3$)$_3$) (TMA), silane (SiH$_4$), and diethyl zinc (DEZ).

The sapphire substrate 1 of single crystal, with its principal crystal plane (c-surface {0001}) cleaned by solvent washing and heat treatment, was set on the susceptor placed in the reaction chamber of the MOVPE apparatus.

The sapphire substrate 1 underwent vapor phase etching at 1100° C. with H$_2$ flowing through the reaction chamber at a flow rate of 2 l/min under normal pressure.

On the sapphire substrate 1 was formed the AlN buffer layer 2 (about 500 Å thick) at 400° C. by supplying H$_2$ at a flow rate of 20 l/min, NH$_3$ at a flow rate of 10 l/min, and TMA at a flow rate of $1.8 \times 10^{-5}$ mol/min.

On the buffer layer 2 was formed the 2.2 μm thick GaN n+-layer 3 of high carrier concentration ($1.5 \times 10^{18}$/cm$^3$) by supplying H$_2$ at a flow rate of 20 l/min, NH$_3$ at a flow rate of 10 l/min, TMG at a flow rate of $1.7 \times 10^{-4}$ mol/min, and silane (diluted to 0.86 ppm with H$_2$) at a flow rate of 200 ml/min for 30 minutes, with the sapphire substrate 1 kept at 1150° C.

On the n+-layer 3 was formed the 1.5 μm thick GaN n-layer 4 of low carrier concentration ($1 \times 10^{15}$/cm$^3$) by supplying H$_2$ at a flow rate of 20 l/min, NH$_3$ at a flow rate of 10 l/min, and TMG at a flow rate of $1.7 \times 10^{-4}$ mol/min, with the sapphire substrate 1 kept at 1150° C.

On the n-layer 4 was formed the 0.2 μm thick GaN $i_L$-layer 5 of low impurity concentration ($5 \times 10^{19}$/cm$^3$ of Zn) by supplying H$_2$ at a flow rate of 20 l/min, NH$_3$ at a flow rate of 10 l/min, TMG at a flow rate of $1.7 \times 10^{-4}$ mol/min, and DEZ at a flow rate of $1.5 \times 10^{-4}$ mol/min, with the sapphire substrate 1 kept at 1000° C.

On the $i_L$-layer 5 was formed the 0.2 μm thick GaN $i_H$-layer 6 of high impurity concentration ($2 \times 10^{20}$/cm$^3$ of Zn) by supplying H$_2$ at a flow rate of 20 l/min, NH$_3$ at a flow rate of 10 l/min, TMG at a flow rate of $1.7 \times 10^{-4}$ mol/min, and DEZ at a flow rate of $1.5 \times 10^{-4}$ mol/min, with the sapphire substrate 1 kept at 900° C.

Figure 18:
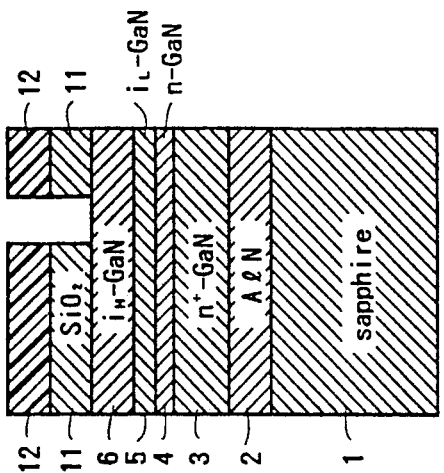
FIGS. 18 to 23 are sectional views illustrating processes for producing a light-emitting diode shown as Example 3 of the present invention.

Thus there was obtained the multi-layer structure as shown in FIG. 18.

Figure 19:
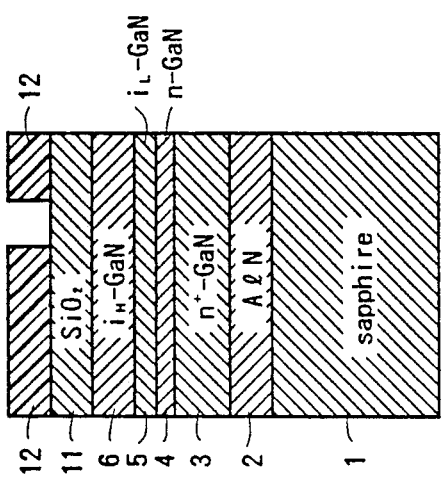

On the $i_H$-layer 6 was formed the 2000 Å thick SiO$_2$ layer 11 by sputtering as shown in FIG. 19. On the SiO$_2$ layer 11 was formed a photoresist layer 12 which subsequently underwent the photolithographic processing to make a pattern for the electrode connected to the n+-layer 3.

Figure 20:
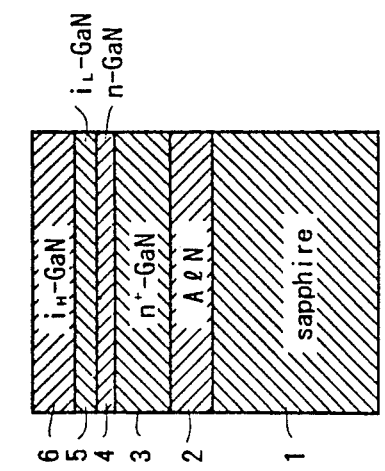

The exposed part (not covered by the photoresist layer 12) of the SiO$_2$ layer 11 underwent etching with hydrofluoric acid for its removal, as shown in FIG. 20.

Figure 21:
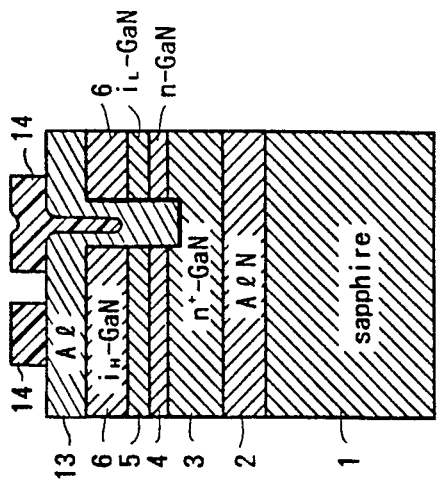

The exposed part (not covered by the photoresist layer 12 and the SiO$_2$ layer 11) of the $i_H$-layer 6 underwent dry etching with CCl$_2$F$_2$ gas at a flow rate of 10 cc/min and a high-frequency electric power of 0.44 W/cm$^2$ in a vacuum of 0.04 Torr and subsequently underwent dry etching with argon. The dry etching removed not only the exposed part of the $i_H$-layer 6 but also the $i_L$-layer 5 and the n-layer 4 and the upper part of the n+-layer 3 which are underneath the exposed part of the $i_H$-layer 6, as shown in FIG. 21.

Figure 22:
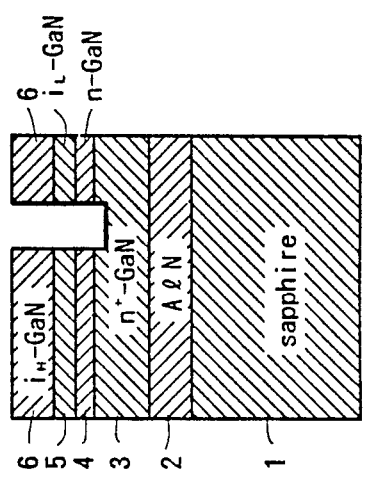

The SiO$_2$ layer 11 remaining on the $i_H$-layer 6 was removed with hydrofluoric arid as shown in FIG. 22.

Figure 23:
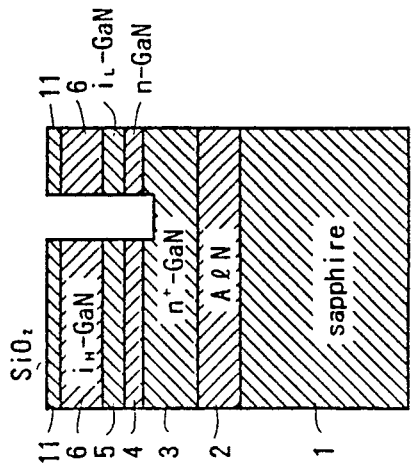

On the entire surface of the sample was formed an Al layer 13 by vapor deposition as shown in FIG. 23. On the Al layer 13 was formed the photoresist layer 14 which subsequently underwent the photolithographic processing to make a pattern for the electrodes connected to the n+-layer 3 and the $i_H$-layer 6, respectively.

The exposed part (not covered by the photoresist layer 14) of the Al layer 13 underwent etching with nitric acid as shown in FIG. 23. The photoresist 14 was removed with acetone. Thus there were formed the electrode 8 for the n+-layer 3 and the electrode 7 for the $i_H$-layer 6.

Such an above-mentioned process could make a gallium nitride light-emitting element of MIS structure as shown in FIG. 17.

The thus obtained light-emitting diode 10 was found to have a luminous intensity of 0.4 mcd. This value is 8 times higher than that of the conventional light-emitting diode which is composed simply of a 0.2 μm thick i-layer with impurity concentration of $2 \times 10^{20}$/cm$^3$ and a 4 μm thick n-layer with a carrier concentration of $5 \times 10^{17}$/cm$^3$.

In addition, the inspection of the luminescent surface revealed that the number of luminescent points is much greater than that of the conventional light-emitting diode.

Figure 24:
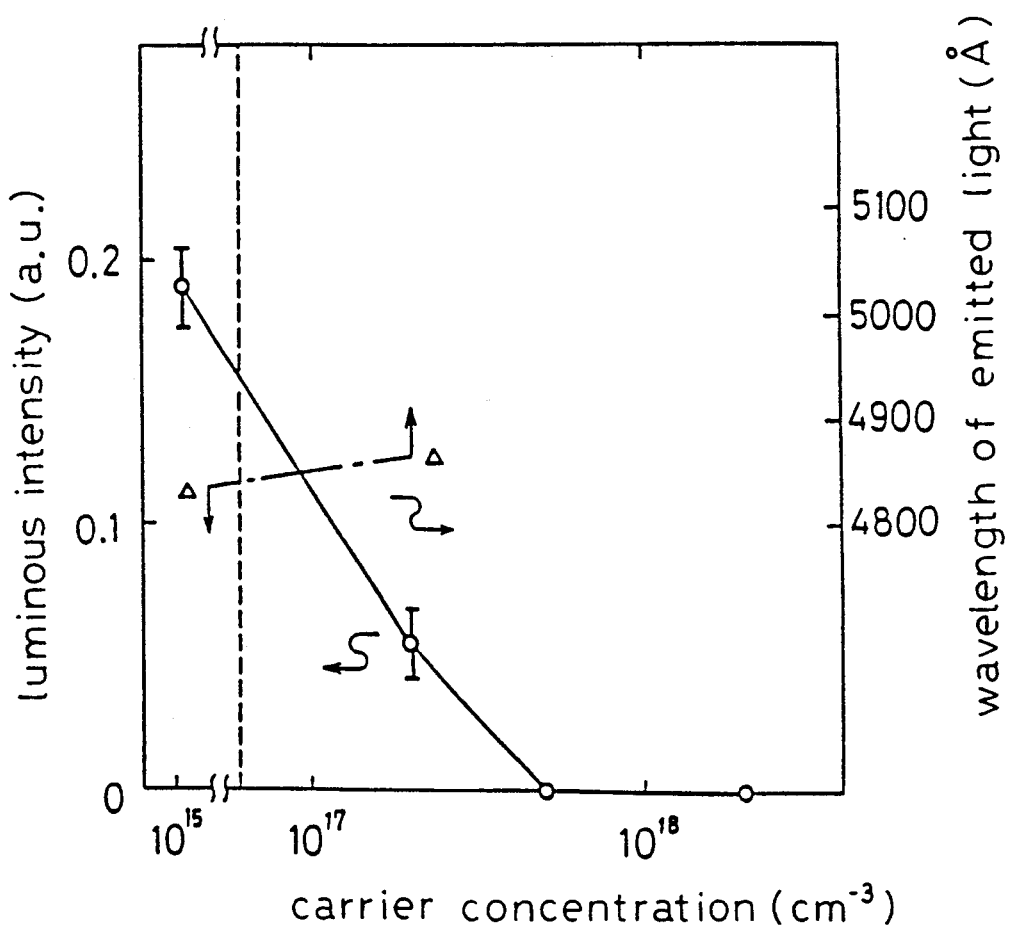
FIG. 24 is a diagram showing relationship between a carrier concentration of an n-layer of low carrier concentration and intensity or wavelength of emitted light with respect to a light-emitting diode shown as Example 3 of the present invention.

Several samples were prepared in the same manner as mentioned above except that the carrier concentration in the n-layer 4 of low carrier concentration was varied, and they were tested for luminous intensity and emission spectrum. The results are shown in FIG. 24. It is noted that the luminous intensity decreases and the emission spectrum shifts to the red side according as the carrier concentration increases.

Figure 25:
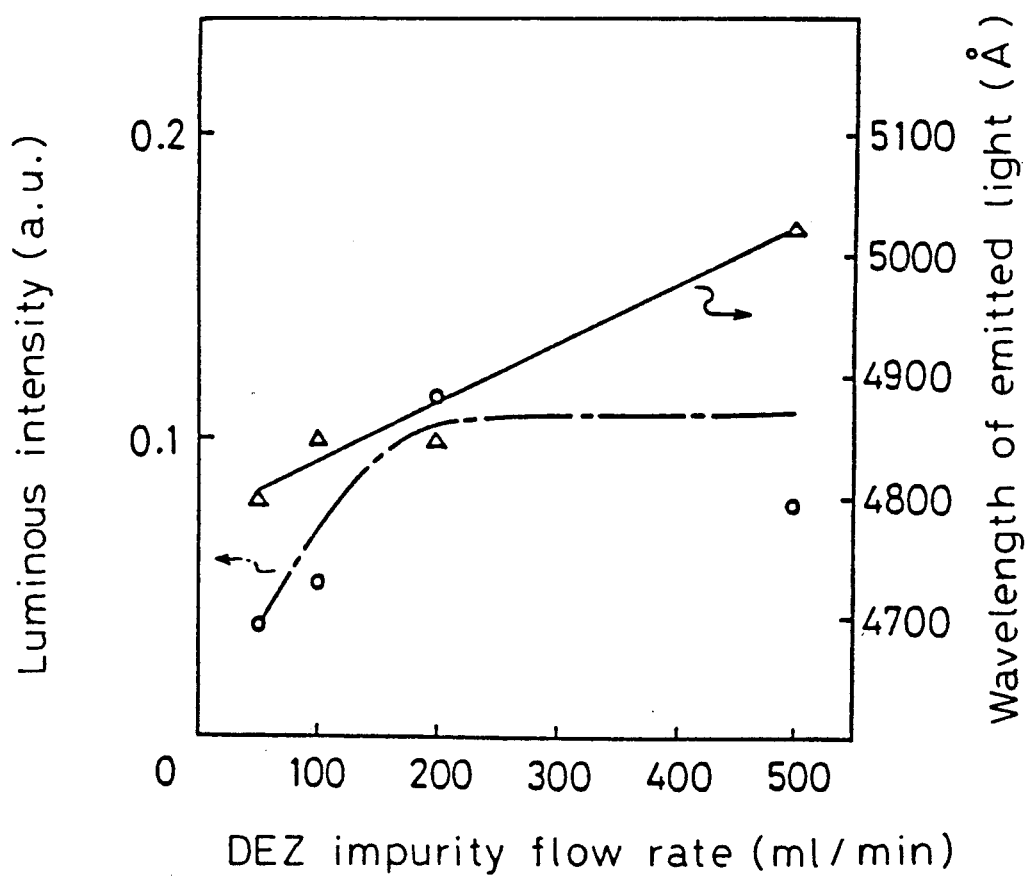
FIG. 25 is a diagram showing relationship between an impurity concentration of an $i_H$-layer of high impurity concentration and intensity or wavelength of emitted light with respect to a light-emitting diode shown as Example 3 of the present invention.

Also, several samples were prepared in the same manner as mentioned above except that the impurity concentration in the $i_H$-layer 6 of high impurity concentration was varied, and they were tested for luminous intensity and emission spectrum. The results are shown in FIG. 25. It is noted that the luminous intensity has a peak value and the emission spectrum shifts to a longer wavelength side when the impurity concentration increases.

Example 4

Figure 26:
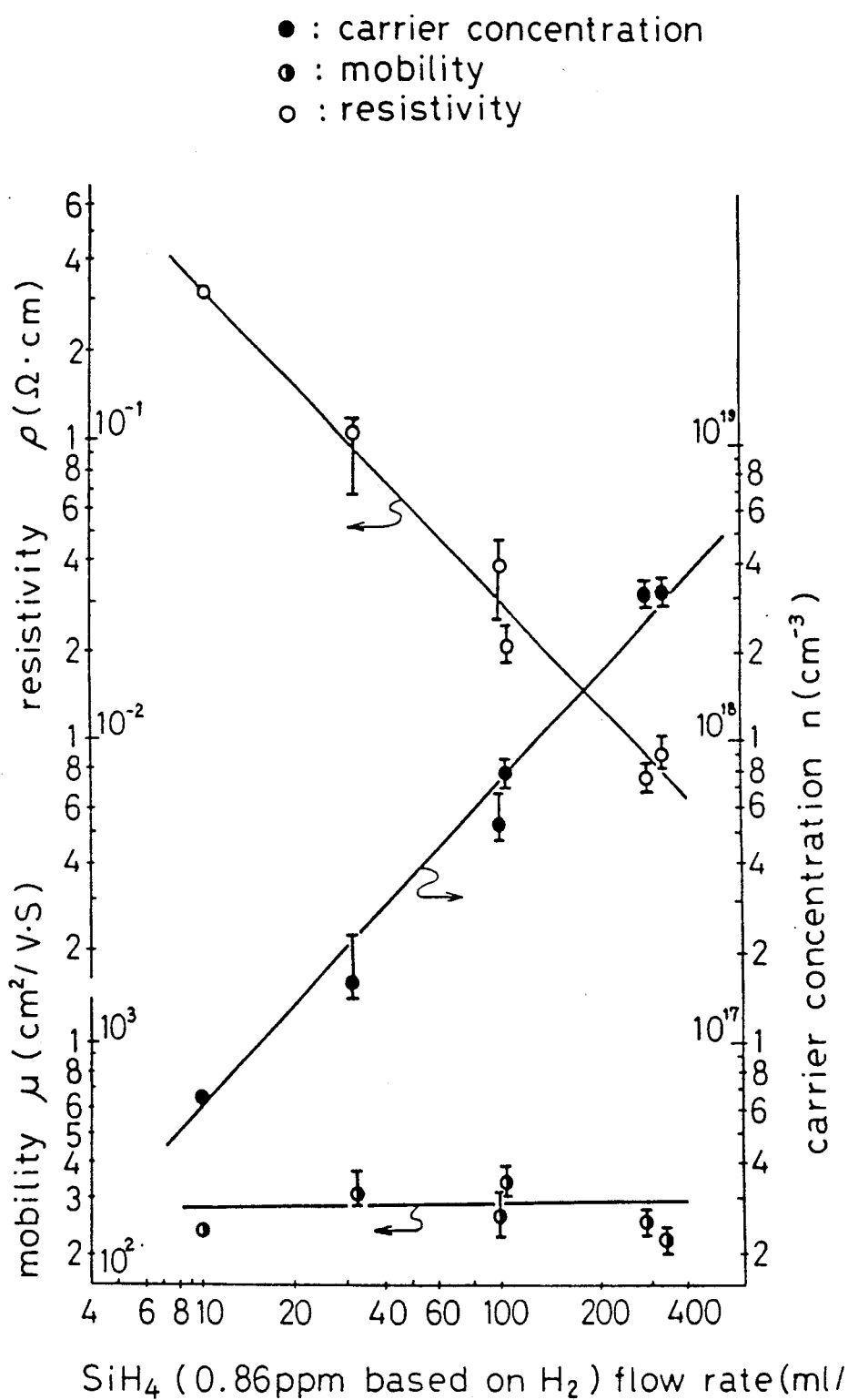
FIG. 26 is a diagram showing the relationship between a flow rate of silane gas and electrical properties of an n-layer formed by vapor phase epitaxy in a process shown as Example 4 of the present invention.

A light-emitting diode 10 of the same structure as in Example 1 was prepared in the same manner as in Example 1 according to the steps shown in FIGS. 2 to 7. The resistivity of the n+-layer 3 was varied in the range of $3\times10^{-1}$ Ωcm to $8\times10^{-3}$ Ωcm by changing the conditions of the vapor phase epitaxy for the n+-layer 3 of high carrier concentration, as shown in FIG. 26. The vapor phase epitaxy was carried out by supplying $H_2$ at a flow rate of 20 l/min, $NH_3$ at a flow rate of 10 l/min, TMG-carrying $H_2$ at a flow rate of 100 cc/min, and $H_2$-diluted silane (0.86 ppm) at a flow rate of 10 cc/min to 300 cc/min. (The TMG-carrying $H_2$ was prepared by bubbling $H_2$ in TMG cooled at $-15°$ C.)

In the above-mentioned case, the resistivity of the n+-layer 3 was varied by changing the flow rate of silane, but it is also possible to achieve the same object by changing the flow rate of other raw material gases or by changing the mixing ratio of silane and other raw material gases.

In this example, silane was used as the Si dopant, but it can be replaced by an organosilicon compound such as tetraethylsilane ($Si(C_2H_5)_4$) in a gaseous state prepared by bubbling with $H_2$.

The process mentioned above permits one to prepare the n+-layer 3 of high carrier concentration and the n-layer 4 of low carrier concentration in such a manner that their resistivity can be controlled as desired.

The thus obtained light-emitting diode 10 was found to have a luminous intensity of 0.2 mcd. This value is 4 times higher than that of the conventional light-emitting diode which is composed simply of an i-layer and an n-layer. In addition, the inspection of the luminescent surface revealed that the number of luminescent points is much greater than that of the conventional light-emitting diode.

What is claimed is:

1. A light-emitting semiconductor device comprising:
   an i-layer of insulating gallium nitride compound semiconductor ($Al_xGa_{1-x}N$; inclusive of $x=0$) doped with p-type impurities;
   an n-layer of n-type gallium nitride compound semiconductor ($Al_xGa_{1-x}N$; inclusive of $x=0$) not doped with p-type impurities and having low carrier concentration, said n-layer being adjacent to said i-layer;
   an n+-layer of n-type gallium nitride compound semiconductor ($Al_xGa_{1-x}N$; inclusive of $x=0$) having high carrier concentration and doped with n-type impurities, said n+-layer being adjacent to said n-layer; and
   wherein a thickness of said n-layer is 0.5-2 $\mu$m and a thickness of said n+-layer is 2-10 $\mu$m.

2. A light-emitting semiconductor device comprising:
   an i-layer of insulating gallium nitride compound semiconductor ($Al_xGa_{1-x}N$; inclusive of $x=0$) doped with p-type impurities;
   an n-layer of n-type gallium nitride compound semiconductor ($Al_xGa_{1-x}N$; inclusive of $x=0$) not doped with p-type impurities and having low carrier concentration, said n-layer being adjacent to said i-layer; and
   an n+-layer of n-type gallium nitride compound semiconductor ($Al_xGa_{1-x}N$; inclusive of $x=0$) having high carrier concentration and doped with n-type impurities, said n+-layer being adjacent to said n-layer.

3. A light-emitting semiconductor device as claimed in claim 2, wherein the carrier concentration of said n-layer is $1\times10^{14}$-$1\times10^{17}$/cm$^3$ and the carrier concentration of said n+-layer is $1\times10^{17}$-$1\times10^{19}$/cm$^3$.

4. A light-emitting semiconductor device as claimed in claim 2, wherein the thickness of said i-layer is 0.03-1.3 $\mu$m.

5. A light-emitting semiconductor device as claimed in claim 2, wherein the impurity concentration of said i-layer is $1\times10^{16}$-$5\times10^{20}$/cm$^3$.

6. A light-emitting semiconductor device as claimed in claim 2, wherein said n+-layer of high carrier concentration is doped with silicon.

7. A light-emitting semiconductor device as in claim 2, further comprising:
   a substrate; and
   an AlN buffer layer formed on said substrate and adjacent to said n+-layer.

8. A light-emitting semiconductor device comprising:
   an i-layer of insulating gallium nitride compound semiconductor ($Al_xGa_{1-x}N$; inclusive of $x=0$) doped with p-type impurities;
   an n-layer of n-type gallium nitride compound semiconductor ($Al_xGa_{1-x}N$; inclusive of $x=0$) not doped with p-type impurities and having a carrier concentration of $1\times10^{14}$/cm$^3$ to $1\times10^{17}$/cm$^3$, said n-layer being adjacent to said i-layer; and
   an n+-layer of n-type gallium nitride compound semiconductor ($Al_xGa_{1-x}N$; inclusive of $x=0$) doped with n-type impurities having a carrier concentration of $1\times10^{17}$/cm$^3$ to $1\times10^{19}$/cm$^3$, said n+-layer being adjacent to said n-layer.

9. A light-emitting semiconductor device comprising:
   an $i_L$-layer of insulating gallium nitride compound semiconductor ($Al_xGa_{1-x}N$; inclusive of $x=0$) containing a low concentration of p-type impurities;
   an $i_H$-layer of insulating gallium nitride compound semiconductor ($Al_xGa_{1-x}N$; inclusive of $x=0$) containing a high concentration of p-type impurities, said $i_H$-layer being adjacent to said $i_L$-layer; and
   an n-layer of n-type gallium nitride compound semiconductor ($Al_xGa_{1-x}N$; inclusive of $x=0$) adjacent to said $i_L$-layer.

10. A light-emitting semiconductor device as claimed in claim 9, wherein a thickness of said n-layer is 2.5-12 $\mu$m.

11. A light-emitting semiconductor device as claimed in claim 9, wherein a carrier concentration of said n-layer is $1\times10^{14}$-$1\times10^{19}$/cm$^3$.

12. A light-emitting semiconductor device as claimed in claim 9, wherein a thickness of said i-layer is 0.01-1 $\mu$m and a thickness of said $i_H$-layer is 0.02-0.3 $\mu$m.

13. A light-emitting semiconductor device as claimed in claim 9, wherein the impurity concentration of said $i_L$-layer is $1\times10^{16}$-$5\times10^{19}$/cm$^3$ and the impurity concentration of said $i_H$-layer is $1\times10^{19}$-$5\times10^{20}$/cm$^3$.

14. A light-emitting semiconductor device as claimed in claim 9, wherein both said $i_L$-layer and said $i_H$-layer are doped with zinc, an amount of doped zinc in said $i_H$-layer being higher than an amount of doped zinc in said $i_L$-layer.

15. A light-emitting semiconductor device as in claim 9, further comprising:
   a substrate; and
   an AlN buffer layer formed on said substrate and adjacent to said n-layer.

16. A light-emitting semiconductor device comprising:
- an $i_L$-layer of insulating gallium nitride compound semiconductor ($Al_xGa_{1-x}N$; inclusive of $x=0$) containing a low concentration of p-type impurities;
- an $i_H$-layer of insulating gallium nitride compound semiconductor ($Al_xGa_{1-x}N$; inclusive of $x=0$) containing a high concentration of p-type impurities, said $i_H$-layer being adjacent to said $i_L$-layer;
- an n-layer of n-type gallium nitride compound semiconductor ($Al_xGa_{1-x}N$; inclusive of $x=0$) of low carrier concentration, said n-layer being adjacent to said $i_L$-layer; and
- an $n^+$-layer of n-type gallium nitride compound semiconductor ($Al_xGa_{1-x}N$; inclusive of $x=0$) of high carrier concentration doped with n-type impurities, said $n^+$-layer being adjacent to said n-layer.

17. A light-emitting semiconductor device as claimed in claim 16, wherein said $n^+$-layer of high carrier concentration is doped with silicon.

18. A light-emitting semiconductor device as claimed in claim 16, wherein both said $i_L$-layer and said $i_H$-layer are doped with zinc, an amount of doped zinc in said $i_H$-layer being higher than an amount of doped zinc in said $i_L$-layer.

19. A light-emitting semiconductor device as in claim 16, further comprising:
- a substrate; and
- an AlN buffer layer formed on said substrate and adjacent to said $n^+$-layer.

* * * * *